(12) United States Patent
Jiang

(10) Patent No.: US 9,280,222 B2
(45) Date of Patent: Mar. 8, 2016

(54) TOUCH ELECTRODE STRUCTURE AND A METHOD FOR MANUFACTURING THE SAME

(71) Applicant: Yau-Chen Jiang, Zhubei (TW)

(72) Inventor: Yau-Chen Jiang, Zhubei (TW)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 317 days.

(21) Appl. No.: 13/670,470

(22) Filed: Nov. 7, 2012

(65) Prior Publication Data

US 2014/0124347 A1    May 8, 2014

(30) Foreign Application Priority Data

Nov. 9, 2011  (CN) .......................... 2011 1 0379425

(51) Int. Cl.
*H01H 13/704*   (2006.01)
*G06F 3/041*    (2006.01)
*G06F 3/044*    (2006.01)
*H03K 17/96*    (2006.01)

(52) U.S. Cl.
CPC ................ *G06F 3/041* (2013.01); *G06F 3/044* (2013.01); *H03K 17/962* (2013.01); *G06F 2203/04103* (2013.01); *Y10T 29/49105* (2015.01)

(58) Field of Classification Search
CPC ......... G06F 3/044; G06F 3/041; G06F 3/045; H05K 3/02; H05K 1/0215; H05K 1/0219; H05K 1/0259; H05K 9/0079; H05K 1/0296; H05K 3/10; B23K 26/36; H03K 17/962; H03K 17/975; H03K 2217/960755; H03K 2017/9602; H01H 2239/006; H01H 1/5805; H01R 12/24

USPC ....... 29/622, 829; 200/600; 345/174; 349/12; 427/58, 123; 174/257
See application file for complete search history.

(56) References Cited

U.S. PATENT DOCUMENTS

| | | | |
|---|---|---|---|
| 8,860,687 B2 * | 10/2014 | Mizuhashi et al. ........... | 345/174 |
| 2003/0168975 A1 * | 9/2003 | Lovell et al. .................. | 313/509 |
| 2008/0030483 A1 * | 2/2008 | Choo et al. .................... | 345/173 |
| 2008/0158181 A1 * | 7/2008 | Hamblin et al. .............. | 345/173 |
| 2009/0101489 A1 * | 4/2009 | Lee ................................ | 200/600 |
| 2010/0117985 A1 * | 5/2010 | Wadia ........................... | 345/174 |
| 2010/0164889 A1 * | 7/2010 | Hristov et al. ................ | 345/173 |
| 2011/0001706 A1 * | 1/2011 | Sanford et al. ................ | 345/173 |
| 2011/0033970 A1 | 2/2011 | Manens et al. | |
| 2011/0304582 A1 * | 12/2011 | Ho et al. ....................... | 345/174 |
| 2012/0013544 A1 * | 1/2012 | Philipp ......................... | 345/173 |
| 2012/0169664 A1 * | 7/2012 | Milne ........................... | 345/174 |

FOREIGN PATENT DOCUMENTS

KR        200835978 A       10/2009
WO      WO 9213328    *    8/1992

* cited by examiner

*Primary Examiner* — Timothy Thompson
*Assistant Examiner* — Michael F McAllister
(74) *Attorney, Agent, or Firm* — Gokalp Bayramoglu

(57) ABSTRACT

The present disclosure discloses a touch panel, a touch electrode structure, and a manufacturing method thereof. The touch electrode structure comprises a plurality of first-axis sensing lines and at least one first laser etching line. The plurality of first-axis sensing lines are formed by laser etching a first conducting layer, wherein each first-axis sensing line at least has a first output pin. The first laser etching line is formed around the corresponding first output pin by laser etching the first conducting layer. Thus, the present disclosure can reduce overall production time by using a simplified manufacturing process in a laser etching process to form an improved touch electrode structure.

19 Claims, 11 Drawing Sheets

TOUCH ELECTRODE STRUCTURE AND A METHOD FOR MANUFACTURING THE SAME

This application claims the benefit of Chinese application No. 201110379425.4, filed on Nov. 9, 2011.

BACKGROUND OF THE INVENTION

1. Field of the Invention

The present disclosure relates to a touch technology, more specifically to a touch electrode structure, a method of manufacturing the same, and a touch panel applying the structure.

2. Description of the Related Art

Touch panels have been widely used, most typically, in smart phones and tablet PCs. Most smart phones and tablet PCs are equipped with a touch panel, which facilitates operation by a user and achieves an operation that is completely different from that of a keyboard. Touch panels are broadly classified into resistive touch panels, capacitive touch panels, acoustic wave touch panels, optical touch panels, and electromagnetic touch panels.

Generally, a touch panel has uniaxial sensing lines or biaxial sensing lines. The uniaxial sensing lines can be designed into a single axis having a function of X-axis or Y-axis sensing locating while the biaxial sensing lines have a plurality of X-axis sensing lines and Y-axis sensing lines arranged in a staggered manner, and intersections of the X-axis sensing lines and the Y-axis sensing lines form matrix sensing points. Generally, axial sensing lines can be made of a conductive film and then a flexible circuit is respectively connected to output pins of the axial sensing lines to transmit signals of each sensing line. For manufacturing process, a photolithographic process is adopted to remove unnecessary parts of the conductive film according to the required pattern such that the axial sensing lines formed are isolated from each other and the output pins are also isolated from each other, thereby achieving a touch sensing structure.

However, the photolithographic process is very complex. For example, exposure, developing, etching, and cleaning steps that are needed to be performed during the photolithographic process need a long production time.

SUMMARY OF THE INVENTION

An objective of the present disclosure is to provide a touch panel, a touch electrode structure, and a manufacturing method thereof, which reduce the overall production time by using, a simplified manufacturing process in a laser etching process to form an improved touch electrode structure.

A touch electrode structure is provided in an embodiment of the present disclosure, wherein the touch electrode structure comprises a plurality of first-axis sensing lines and at least one first laser etching line. The plurality of first-axis sensing lines are formed by laser etching a first conducting layer, wherein each first-axis sensing line at least has a first output pin. The first laser etching line is formed around the corresponding first output in such that the first output pins are electrically insulated from each other.

In an embodiment of the present disclosure, each first-axis sensing line and the first laser etching line are formed by etching the first conducting layer with a laser beam having a wavelength of between 200 nm and 300 nm. The touch electrode structure further comprises a plurality of second-axis sensing lines and at least one second laser etching line. Each second-axis sensing line at least has a second output pin, and the second laser etching line is formed around the corresponding second output pin. Each second-axis sensing line and the second laser etching line are formed by etching a second conducting layer with a laser beam having a wavelength between 200 nm and 300 nm. The first conducting layer and the second conducting layer are located at different sides of a substrate.

In another embodiment of the present disclosure, if the first-axis sensing lines and the second-axis sensing lines are formed in a same conducting layer at one side of the substrate by laser etching, each first-axis sensing line can comprise a plurality of first conductive cells and a plurality of first bridging wires. The plurality of first conductive cells are disposed at intervals along a first axis, and the plurality of first bridging wires electrically connect the adjacent first conductive cells along the first axis respectively. Similarly, each second-axis sensing line can also comprise a plurality of second conductive cells and a plurality of second bridging wires. A disposition area can be delimited between the adjacent first-axis sensing lines and between the adjacent first conductive cells respectively. The plurality of second conductive cells are respectively disposed in the disposition area. The plurality of second bridging wires cross over the first bridging wires to electrically connect the adjacent second conductive cells along a second axis respectively.

In one embodiment of the present disclosure, a method for manufacturing a touch electrode structure comprises the steps of: laser etching a first conducting layer to form a plurality of first-axis sensing lines, wherein each first-axis sensing line at least has a first output pin; further, laser etching the first conducting layer to form at least one first laser etching line around the corresponding first output pin such that the first output pins are electrically insulated from each other.

In one embodiment of the present disclosure, a touch panel comprises a substrate, a plurality of axis sensing lines, and at least one laser etching line. The plurality of axis sensing lines are formed in a conducting layer at a same side of the substrate or in conducting layers at different sides of the substrate by laser etching. Each axis sensing line at least has an output pin, and the laser etching line is formed around the corresponding output pin such that the output pins are electrically insulated from each other.

Another objective of the present disclosure is to provide a touch panel, a touch electrode structure and a manufacturing method using a laser etching process, which improves production efficiency and reduces production cost. Moreover, in the present disclosure, a plurality of adjacent laser etching lines are generated between the output pins to prevent short circuit between the output pins from happening and reduce time expended in removing a large area of the conducting layer by laser. Furthermore, in an embodiment of the present disclosure, wavelength of the laser etching can generate proper laser energy and prevent laser etching from destroying surface of the substrate, thereby not generating etching marks.

BRIEF DESCRIPTION OF THE DRAWINGS

For those skilled in the art to understand the present disclosure, numerous embodiments and drawings are described below, but it should be noted that the drawings are for illustration purpose only and do not limit the scope of the present disclosure in any manner.

DETAILED DESCRIPTION OF THE EMBODIMENTS

Figure 1:
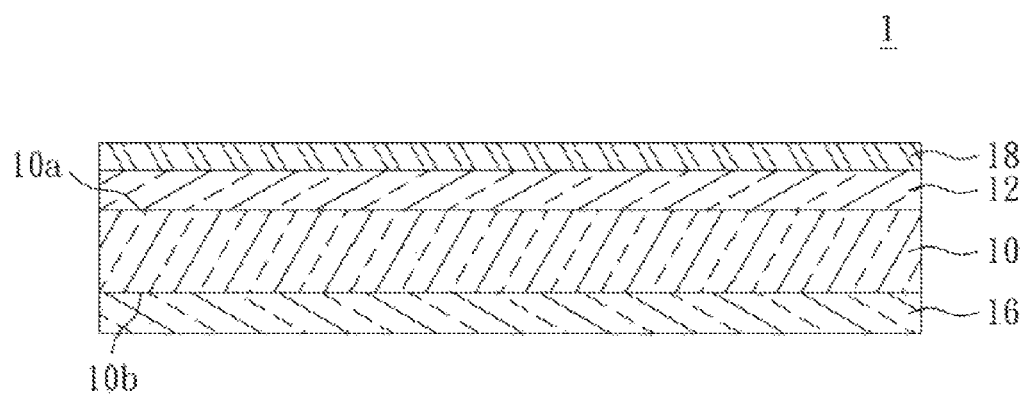
FIG. 1 is a sectional view of a touch panel with two conducting layers in accordance with an embodiment of the present disclosure.

FIG. 1 is a sectional view of a touch panel with two conducting layers in accordance with an embodiment of the present disclosure. As shown in FIG. 1, the present disclosure demonstrates a structure with two conducting layers. A touch panel 1 comprises a substrate 10, a first conducting layer 12, a second conducting layer 16, and a protection layer 18. The substrate 10 is made of a material with high light transmittance and can be a planar or non-planar thin plate. For example, the substrate 10 can be made up of glass, plastic or mixed glass/plastic and formed into a glass thin plate or a flexible thin plate; the flexible thin plate can be made of polycarbonate (PC), polyester (PET), polymethyl methacrylate (PMMA) or cyclic olefin copolymer (COC).

The first conducting layer 12 is formed on a first surface 10a of the substrate 10 and the second conducting layer 16 is formed on a second surface 10b of the substrate 10 such that the first conducting layer 12 is insulated from the second conducting layer 16 by means of the substrate 10. Moreover, after etching the first conducting layer 12 and the second conducting layer 16, a patterned structure can be formed respectively, thereby forming a touch electrode structure of the touch panel 1 of the present embodiment.

Figure 2A:
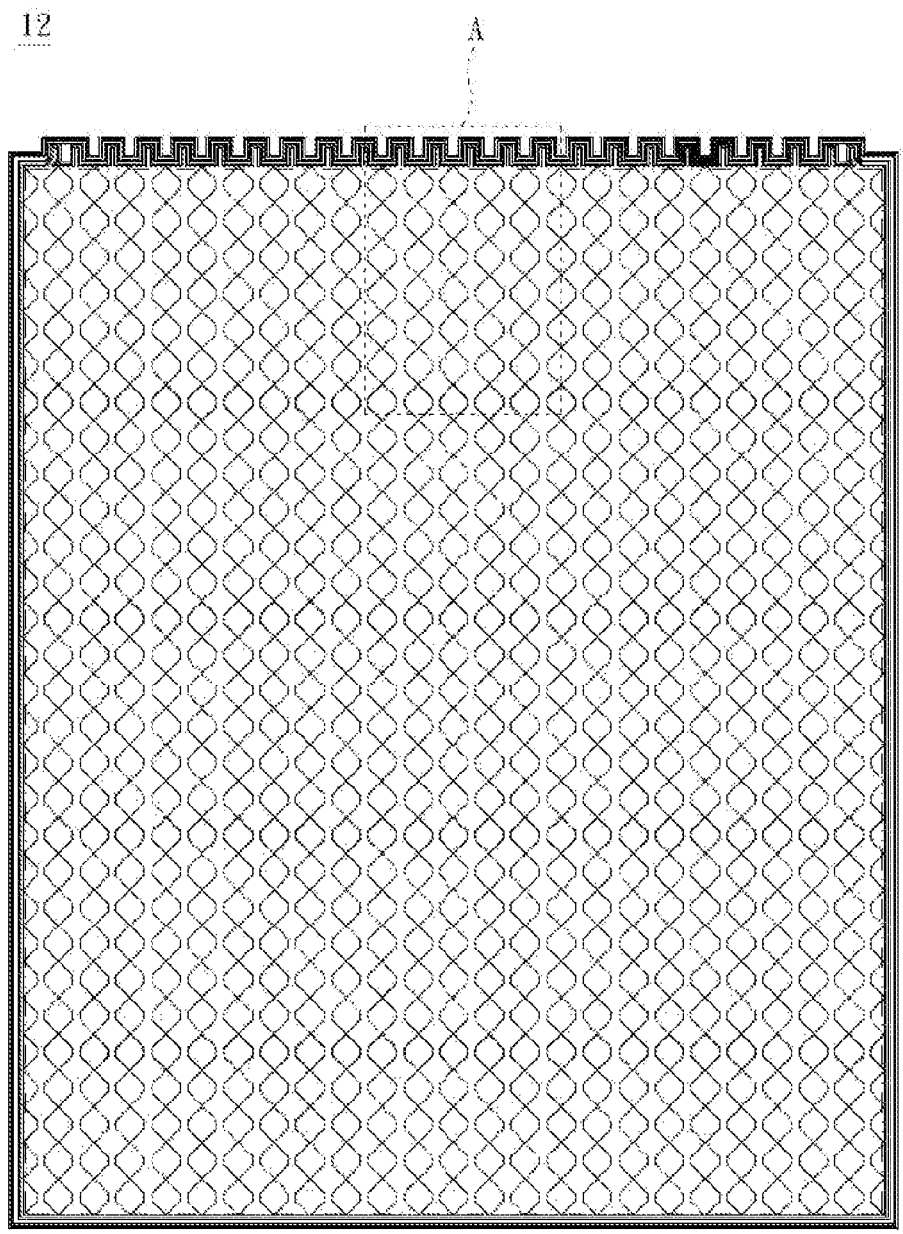
FIG. 2A is a top view of a first conducting layer in accordance with an embodiment of the present disclosure.
Figure 2B:
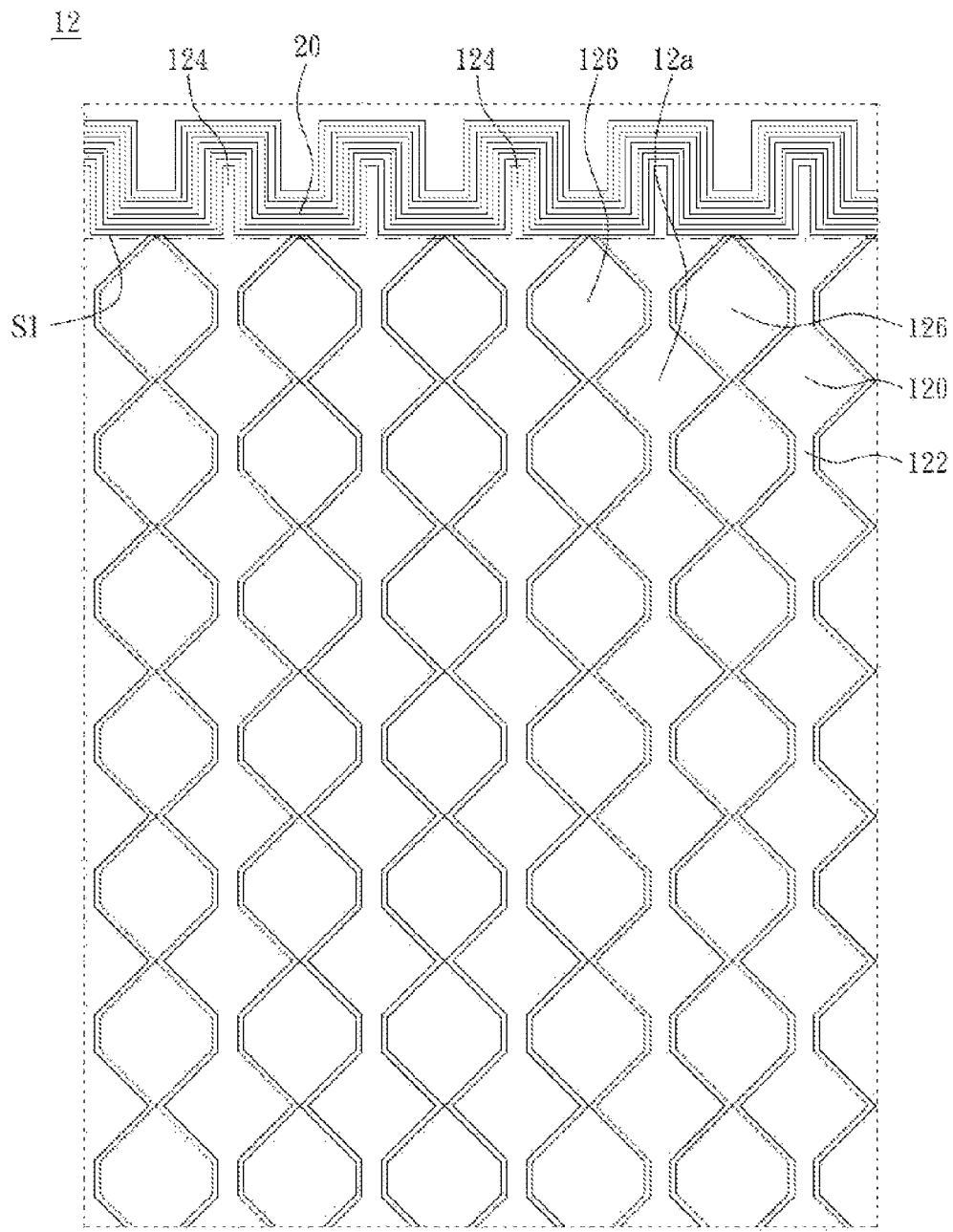
FIG. 2B is a partially enlarged view of area A shown in FIG. 2A.

FIG. 2A is a to view of a first conducting layer in accordance with an embodiment of the present disclosure and FIG. 2B is a partial enlarge view of area A shown in FIG. 2A. As shown in the figures, the patterned structure formed in the first conducting layer 12 comprises M first-axis sensing lines 12a and M first output pins 124 corresponding to the first-axis sensing lines 12a, wherein M is a positive integer larger than 1. More specifically, the etching process is to etch the first conducting layer 12 according to the required electrode pattern so as to map out a first external contour S1 of the patterned structure and then remove redundant blocks 126 to form the required pattern. The first conductive layer 12 can be a transparent conducting layer made up of indium tin oxide (ITO) or antimony-doped tin oxide (ATO).

In an embodiment of the present disclosure, a patterned structure is formed by a laser etching process. For the laser etching process, a laser beam with a wavelength between 200 nm and 300 nm should be selected. Preferably, the laser etching process etches the first conducting layer 12 with a laser beam having a wavelength of 266 nm, wherein etching depth of the laser beam can make the first conducting layer 12 be cut off exactly and completely, thereby preventing the laser beam from damaging the substrate 10 or other film layers.

Further, the M first-axis sensing lines 12a in the patterned structure of the present embodiment are paralleled to each other and each first-axis sensing line 12a can be straight strip shaped or be composed of a plurality of mutually connected first conductive cells 120. The first conductive cells 120 are square-shaped or diamond-shaped, and the adjacent first conductive cells 120 along the first axis can be electrically connected by a first bridging wire 122 such that each first-axis sensing line 12a forms a chain shape by connecting a plurality of squares or diamonds. Besides, the drawings of the present embodiment show that a first output pin 124 is formed correspondingly to one end of each first-axis sensing line 12a, but it is not limited by the present disclosure. Certainly, the first output pin 124 can also be formed correspondingly at both ends of each first-axis sensing line 12a respectively.

In an embodiment of the present disclosure, the first conductive layer 12 is further etched at the outer side of a first external contour S1 through the laser etching process to form at least one laser etching line 20, thereby ensuring that the laser etching line 20 is disposed around each first output pin 124, which prevents a short circuit from happening. Number of the laser etching lines 20 and space between the laser etching lines 20 are not limited by the present disclosure and those skilled in the art can understand that the more the laser etching lines 20 (namely, the more the layers composed of the laser etching lines 20 are), the better isolated and insulated the first output pins 124 are from each other. Preferably, width of each laser etching line 20 is less than 150 μm, and there are at least seven adjacent laser etching lines 20 at the outer side of the first external contour S1.

Figure 3A:
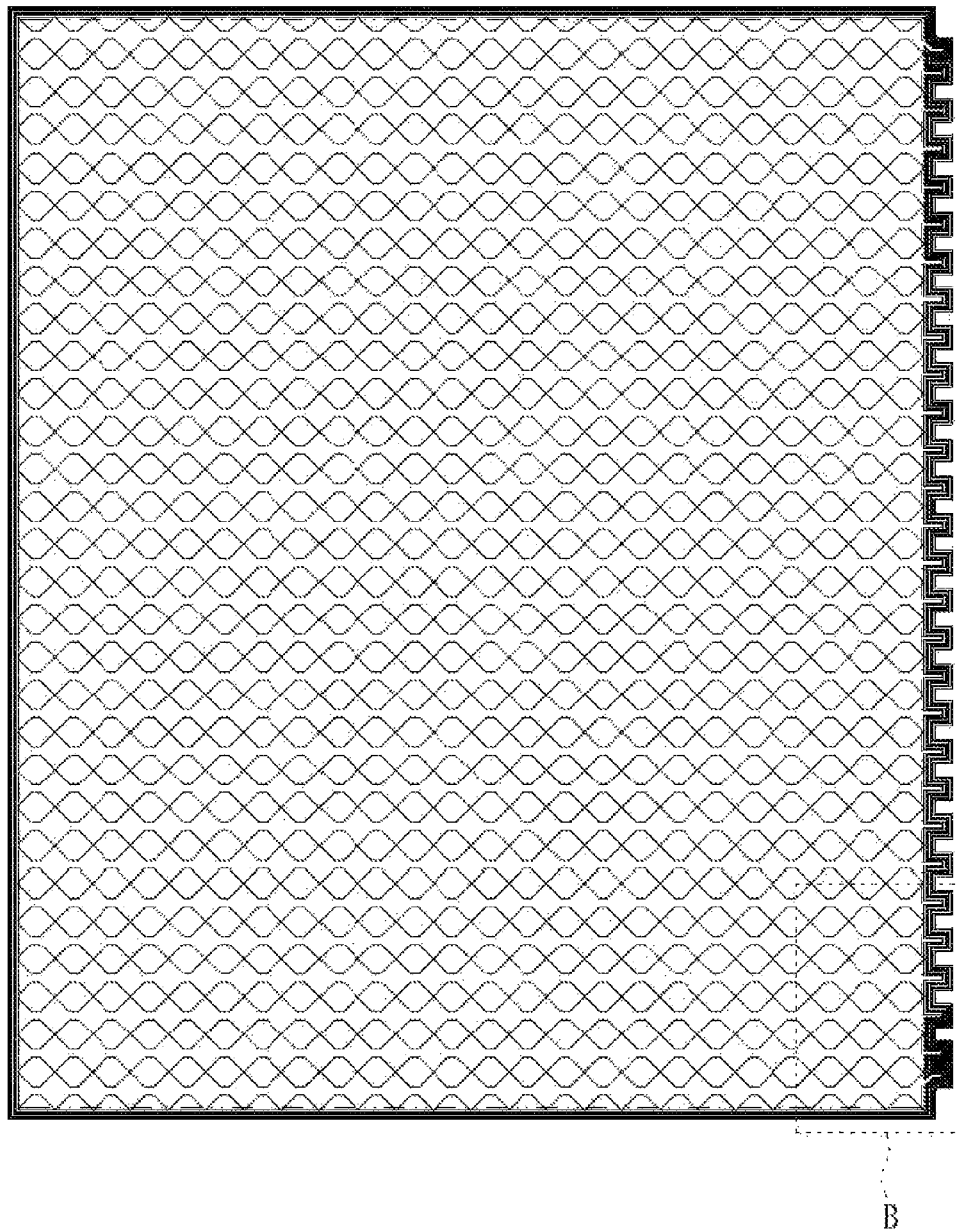
FIG. 3A is a top view of a second conducting layer in accordance with an embodiment of the present disclosure.
Figure 3B:
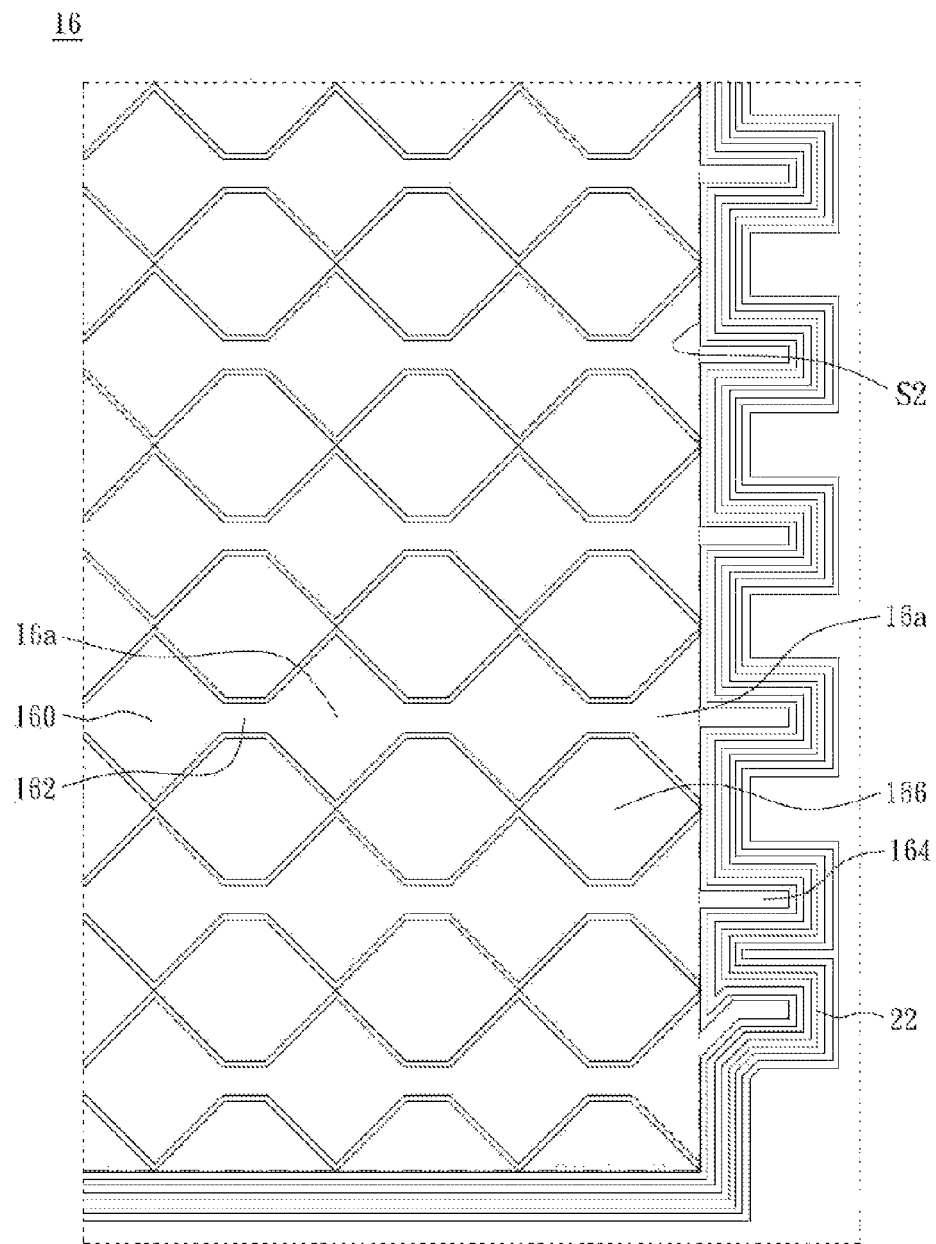
FIG. 3B is a partially enlarged view of area B shown in FIG. 3A.

FIG. 3A is a top view of a second conducting layer in accordance with another embodiment of the present disclosure and FIG. 3B is a partially enlarged view of area B shown in FIG. 3A. As shown in the figures, similar to the etching process for the first conducting layer 12 of FIG. 2, the patterned structure formed in the second conducting layer 16 by the laser etching process comprises P second-axis sensing lines 16 a and P second output pins 164 corresponding to the second-axis sensing lines 16 a, wherein P is a positive integer larger than 1. Besides, the second conductive layer 16 can be a transparent conducting layer made up of indium tin oxide (ITO) or antimony-doped tin oxide (ATO). In practice, for the laser etching process, a laser beam with a wavelength between 200 nm and 300 nm should be selected. Preferably, the laser etching process etches the second conducting layer 16 with a laser beam having a wavelength of 266 nm, wherein etching depth of the laser beam can make the second conducting layer 16 be cut off exactly and completely, thereby preventing the laser beam from damaging the substrate 10 or the first conducting layer 12.

Similarly, the P second-axis sensing lines 16a in the patterned structure of the second conducting layer 16 are paralleled to each other and each second-axis sensing line 16a can be straight strip shaped or be composed of a plurality of mutually connected second conductive cells 160. The second conductive cells 160 are square-shaped or diamond-shaped, and the adjacent second conductive cells 160 along the second axis can be electrically connected by a second bridging wire 162 such that each second-axis sensing line 16a becomes a chain shape formed by connecting a plurality of squares or diamonds.

In an embodiment of the present disclosure, the second conductive layer 16 is further etched at the outer side of a second external contour S2 of the patterned structure through the laser etching process to form at least one laser etching line 22, thereby ensuring that the laser etching line 22 is disposed around each second output pin 164 and thus preventing short circuit from happening.

Further, it can be seen that the patterned structure of the first conducting layer 12 is approximately identical to that of the second conducting layer 16. The difference lies in the extension directions of the first-axis sensing lines 12a and the second-axis sensing lines 16a. In practice, the extension direction of the first-axis sensing lines 12a should be perpendicular to that of the second-axis sensing lines 16a, namely, the first-axis sensing lines 12a can extend along X axis and the second-axis sensing lines 16a can extend along Y axis. Besides, if the first-axis sensing lines 12a and the second-axis sensing lines 16a are both designed as a chain shape formed by connecting squares or diamonds, the first conductive cells 120 in the first-axis sensing lines 12a can correspond to redundant blocks 166 of the second conducting layer 16 and the second conductive cells 160 in the second-axis sensing lines 16a can correspond to the redundant blocks 126 of the first conducting layer 12.

Moreover, the protruding directions of the M first output pins 124 and the P second output pins 164 are also different. For example, the M first output pins 124 can be disposed at one end of the first-axis sensing lines 12a along X axis, and the P second output pins 164 can be disposed at one end of the second-axis sensing lines 16a along Y axis.

Further, the protection layer 18 is further disposed on the first conducting layer 12 as a surface used for touching of the touch panel 1 to protect the film layers disposed underneath. The protection layer 18 can be made up of glass, acrylic acid or sapphire, and can be processed through strengthening, anti-glare, anti-bacterium, etc.

In order to make the structure of the touch panel 1 clearer, further description will be made below according to the structures shown in FIG. 1, FIG. 2A, FIG. 2B, FIG. 3A and FIG. 3B, integrated with a method of manufacturing a touch electrode structure of the present disclosure.

Figure 4:
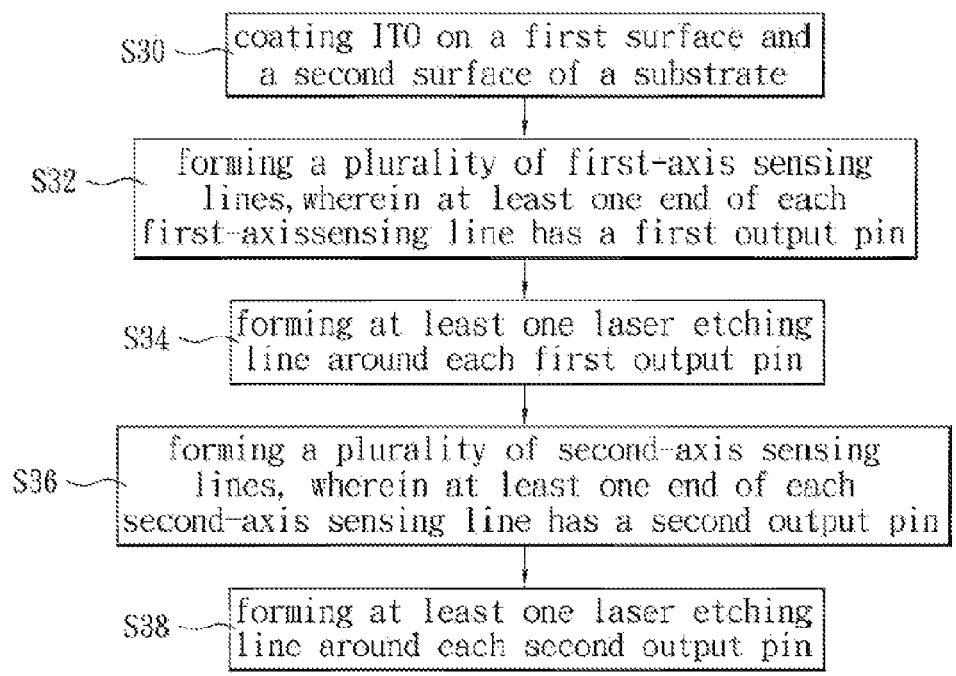
FIG. 4 is a flowchart of a method of manufacturing a touch electrode structure in accordance with an embodiment of the present disclosure.

FIG. 4 is a flowchart of a method of manufacturing a touch electrode structure in accordance with an embodiment of the present disclosure. As shown in FIG. 4, the method of manufacturing comprises Step S30: first coating ITO on a first surface 10a and a second surface 10b of a substrate 10 such that a first conducting layer 12 and a second conducting layer 16 is respectively formed on the first surface 10a and the second surface 10b of the substrate 10. Step S32: laser etching the first conducting layer 12 according to the required electrode pattern so as to map out a first external contour S1 of a patterned structure in the first conducting layer 12 and then remove redundant blocks 126 to form a plurality of first-axis sensing lines 12a, wherein at least one end of each first-axis sensing line 12a has a first output pin 124.

Further, at Step S34: laser etching the first conducting layer 12 to form at least one laser etching line 20 around each first output pin 124. In an embodiment of the present disclosure, a plurality of adjacent laser etching lines 20 can be formed, and besides being formed around each first output pin 124, the laser etching lines 20 can be further extended to the outer side of the first external contour S1 of the whole patterned structure.

Further, once the patterned structure of the first conducting layer 12 is completed, Step S36 is performed: laser etching the second conducting layer 16 according to the required electrode pattern so as to map out a second external contour S2 of a patterned structure in the second conducting layer 16 and then remove redundant blocks 166 to form a plurality of second-axis sensing lines 16a, wherein at least one end of each second-axis sensing line 16a has a second output in 164. At Step S38: laser etching the second conducting layer 16 to for at least one laser etching line 22 around each second output pin 164. Similarly, in an embodiment of the present disclosure, a plurality of adjacent laser etching lines 22 can be formed, and besides being formed around each second output pin 164, the laser etching lines 22 can be further extended to the outer side of the second external contour S2 of the whole patterned structure.

In another embodiment of the present disclosure, the first-axis sensing lines 12a and the second-axis sensing lines 16a in the touch electrode structure are used for transmitting driving signals and sensing signals respectively, thereby achieving the touch sensing function. A control unit of the touch panel electrically connects the first-axis sensing lines 12a and the second-axis sensing lines 16a through a flexible circuit so as to provide driving signals and receive sensing signals.

Figure 5A:
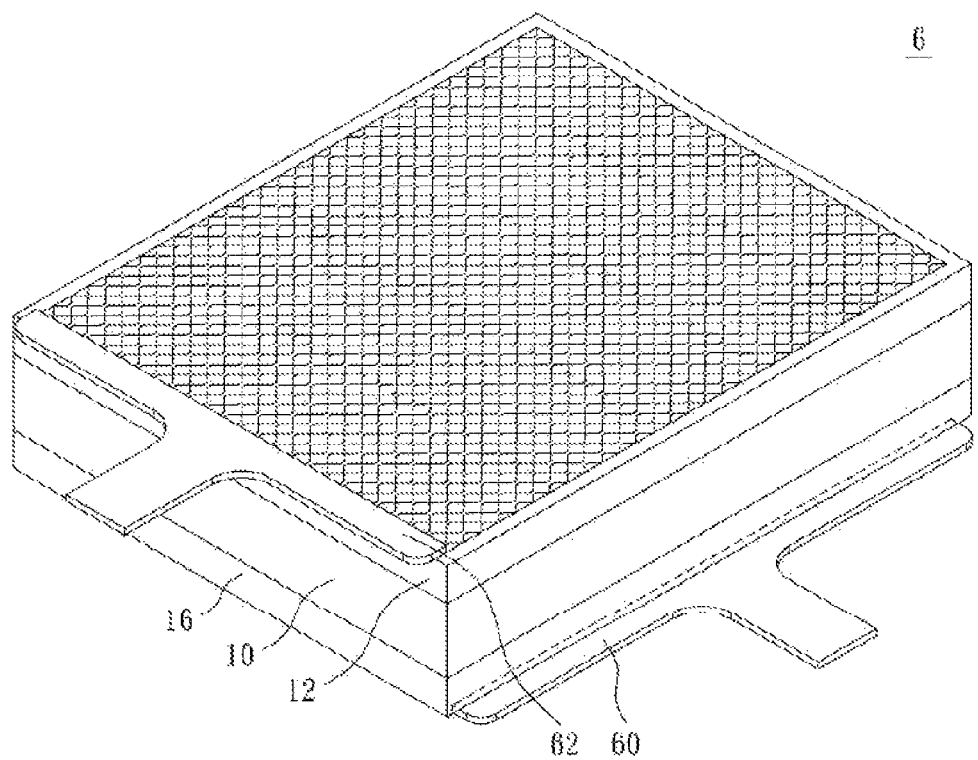
FIG. 5A is a stereoscopic view of a touch panel with two conducting layers in accordance with another embodiment of the present disclosure.
Figure 5B:
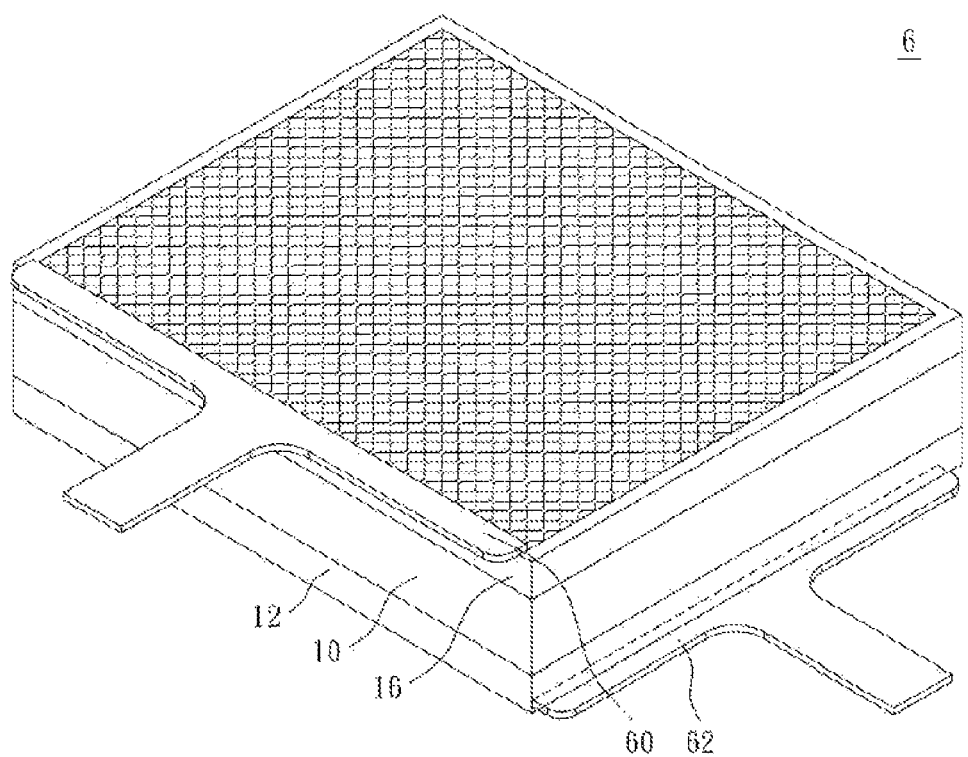
FIG. 5B is another stereoscopic view of a touch panel with two conducting layers in accordance with another embodiment of the present disclosure.

To be convenient for description, the above-mentioned embodiment for a touch panel with two conducting layers is illustrated hereby. FIG. 5A is a stereoscopic view of a touch panel with two conducting layers in accordance with another embodiment of the present disclosure and FIG. 5B is another stereoscopic view of a touch panel with two conducting layers in accordance with another embodiment of the present disclosure. As shown in the figures, a touch panel 6 comprises a flexible circuit 60 and a flexible circuit 62. The flexible circuit 60 can be electrically connected to first output pins 124 along a first axis, and the flexible circuit 62 can be electrically connected to second output pins 164 along a second axis.

In an embodiment of the present disclosure, a plurality of laser etching lines has been used in the present disclosure for removing the conducting layer around the output pins such that the adjacent output pins can be effectively isolated and insulated from each other. When the flexible circuit 60 is laminated and connected to the first conducting layer 12 (or when the flexible circuit 62 is laminated and connected to the second conducting layer 16), a plurality of pins in the flexible circuit 60 can accurately correspond to the plurality of first output pins 124 respectively (or a plurality of pins in the flexible circuit 62 can accurately correspond to the plurality of second output pins 164 respectively). Certainly, those skilled in the art can understand that the output pins can be further electrically connected to the flexible circuits through extendedly disposed metal traces according to the layout need for the touch panel of the present disclosure.

Figure 6A:
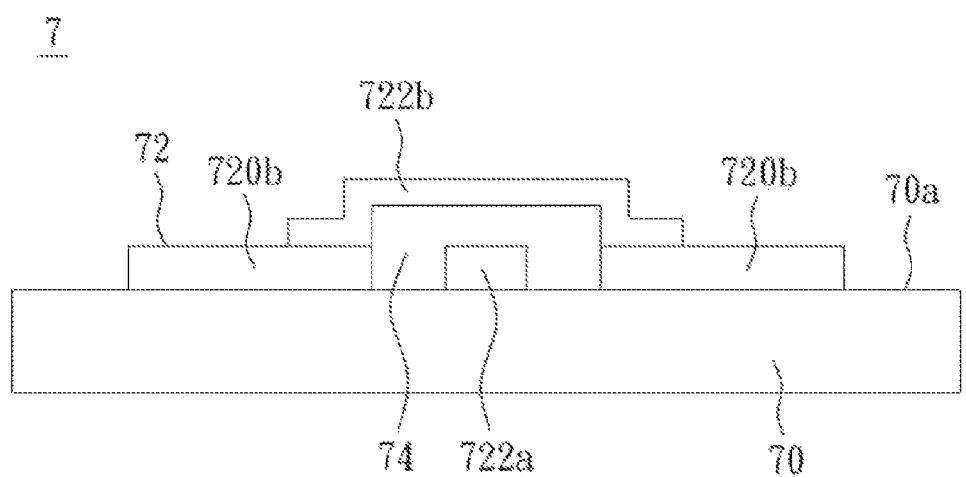
FIG. 6A is a sectional view of a touch panel with a single conducting layer in accordance with an embodiment of the present disclosure.
Figure 6B:
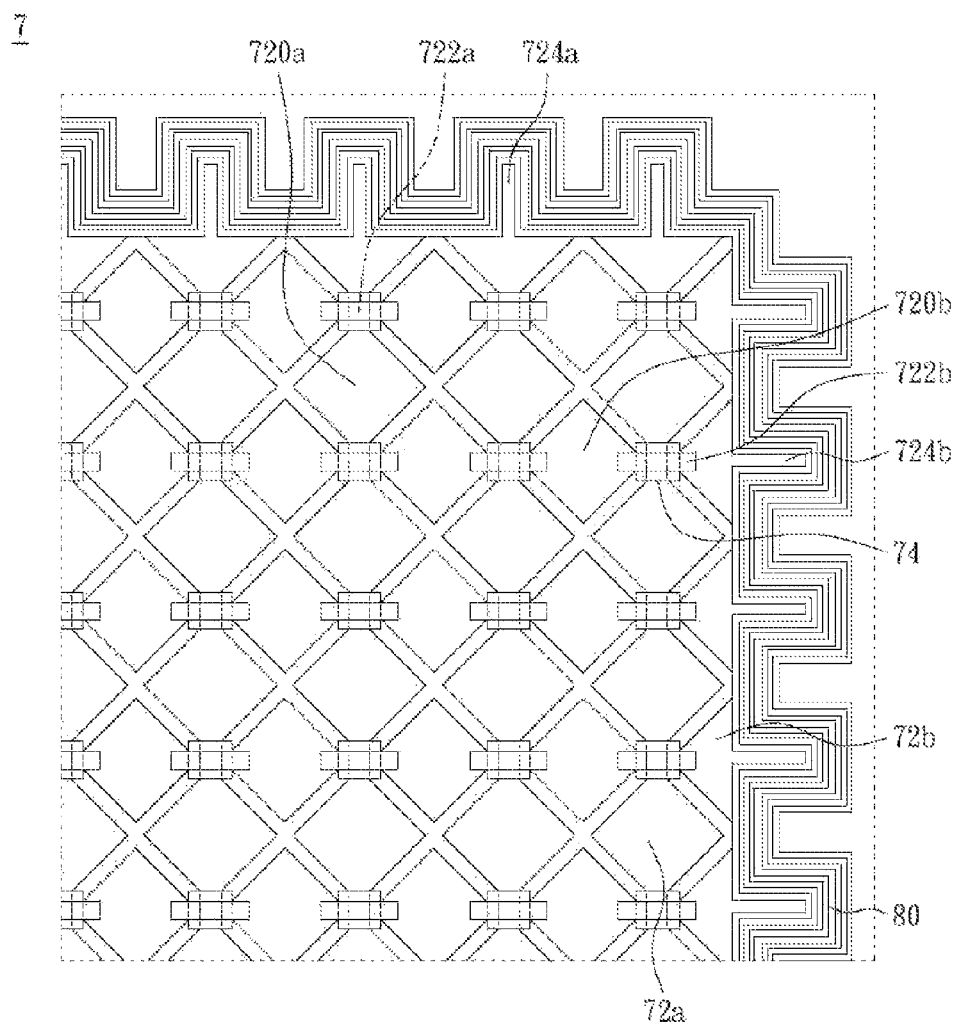
FIG. 6B is a top view of a touch panel with a single conducting layer in accordance with an embodiment of the present disclosure.
Figure 6C:
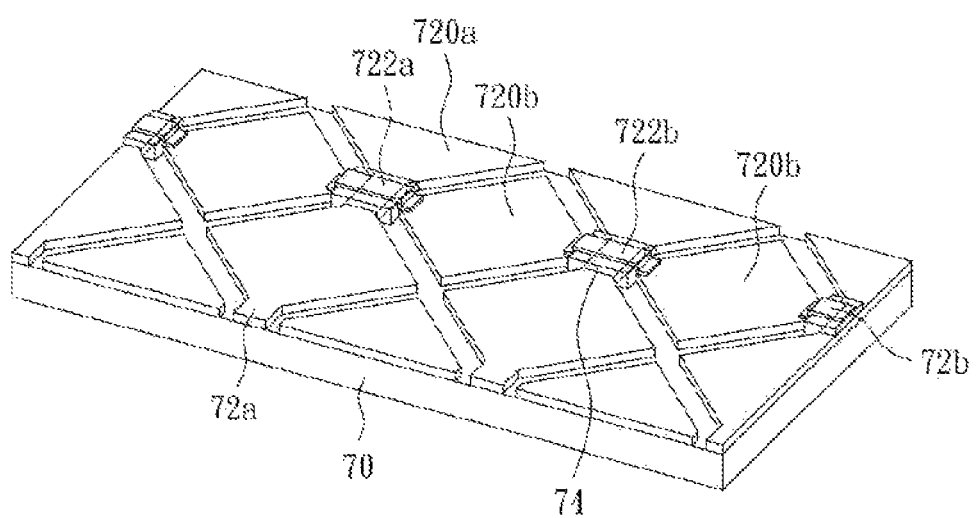
FIG. 6C is a stereoscopic view of a touch panel with a single conducting layer in accordance with an embodiment of the present disclosure.

In another embodiment, the present disclosure is not limited to be applied to a touch panel with two conducting layers. FIG. 6A, FIG. 6B and FIG. 6C are respectively a sectional view, a top view, and a stereoscopic view of a touch panel with a single conducting layer in accordance with an embodiment of the present disclosure. As shown in the figures, the present embodiment demonstrates a structure with a single conducting layer. A touch panel 7 comprises a substrate 70, and a conducting layer 72 and an insulation layer 74 formed on a first surface 70a of the substrate 70. After laser etching the conducting layer 72 on the first surface 70a of the substrate 70, a plurality of first conductive cells 720a, a plurality of first bridging wires 722a, a plurality of first output pins 724a, a plurality of second conductive cells 720b, and a plurality of second output pins 724b can be formed. Moreover, a plurality of adjacent laser etching lines 80 are further formed around the plurality of first output pins 724a and the plurality of second output pins 724*b* by laser etching such that the first output pins 724*a* are insulated from the second output pins 724*b*.

In an embodiment of the present disclosure, the plurality of first conductive cells 720*a*, the plurality of first bridging wires 722*a*, and the plurality of first output pins 724*a* can form a plurality of first-axis sensing lines 72*a*. The plurality of first-axis sensing lines 72*a* can be straight strip shaped and paralleled to each other, and the first conductive cells 720*a* can be square-shaped or diamond-shaped. The adjacent first conductive cells 720*a* along the first axis can be mutually connected by the first bridging wires 722*a* such that each first-axis sensing line 72*a* becomes a chain shape formed by connecting a plurality of squares or diamonds. Besides, one end of each first-axis sensing line 72*a* connects one first output pin 724*a* correspondingly.

Further, the plurality of second conductive cells 720*b* and the plurality of second output pins 724*b* can also form a plurality of second-axis sensing lines 72*b* through connection by a plurality of second bridging wires 722*b*. In design, the second bridging wires 722*b* can be made of a conductive material such as metal, ITO, ATO, etc. Specifically, part of the insulation layer 74 is disposed on the first bridging wires 722*a* and then the second bridging wires 722*b* are overlaid on the insulation layer 74 such that the insulation layer 74 can separate the first bridging wires 722*a* from the second bridging wires 72*b* and thus make the first-axis sensing lines 72*a* insulated from the second-axis sensing lines 72*b*. Besides, by bridging the adjacent second conductive cells 720*b* along the second axis with the second bridging wires 722*b*, each second-axis sensing line 72*b* can form a chain shape by connecting a plurality of squares or diamonds.

In an embodiment of the present disclosure, considering the first-axis sensing lines 72*a* and the second-axis sensing lines 72*b* separately, the plurality of first-axis sensing lines 72*a* are paralleled to each other and the plurality of first conductive cells 720*a* are disposed at intervals so that a disposition area can be delimited between the adjacent first-axis sensing lines 72*a* and between the adjacent first conductive cells 720*a* respectively. The plurality of second conductive cells 720*b* are respectively disposed in the disposition area and by further disposing the insulation layer 74, the second bridging wires 722*b* cross over the first bridging wires 722*a* to electrically connect the adjacent second conductive cells 720*b* along the second axis, thereby forming the second-axis sensing lines 72*b*.

To sum up, the touch electrode structure and the manufacturing method provided by the present disclosure, when compared with a photolithographic process, is simpler in execution and shorter in production time, and is more applicable to the manufacturing of large-size touch panels. Besides, the laser etching process has significantly fewer problems in material wastage and the manufacturing equipment is much simpler and therefore the overall production cost is lower. Moreover, in the present disclosure, forming a plurality of adjacent laser etching lines around each output pin by laser etching can not only save the time needed for large-area laser etching but also can also prevent short circuit between the output pins. Furthermore, in the embodiments of the present disclosure, wavelength of the laser etching can generate proper laser energy and prevent laser etching, from destroying surface of the substrate or other film layers, thereby not generating etching marks.

While certain embodiments have been shown and described, various modifications and substitutions may be made thereto without departing from the spirit and scope of the invention. Therefore, it is to be understood that the present invention has been described by way of illustration and not limitations.

What is claimed is:

1. A method of manufacturing a touch electrode structure, comprising the steps of:
   laser etching a first conducting layer to form a plurality of first-axis sensing lines, wherein each said first-axis sensing line at least comprises a first output pin; and
   laser etching the first conducting layer to form a plurality of first laser etching lines around the corresponding first output pin such that the first output pins are electrically insulated from each other, and a part of the first conducting layer remains between the adjacent first laser etching lines.

2. The method of manufacturing a touch electrode structure as claimed in claim 1, wherein the first-axis sensing lines and the first laser etching line are formed by etching the first conducting layer with a laser beam having a wavelength between 200 nm and 300 nm.

3. The method of manufacturing a touch electrode structure as claimed in claim 1, further comprising:
   laser etching a second conducting layer to form a plurality of second-axis sensing lines, wherein each said second-axis sensing line at least comprises a second output pin; and
   laser etching the second conducting layer to form a plurality of second laser etching lines around the corresponding second output pin such that the second output pins are electrically insulated from each other, and a part of the second conducting layer remains between the adjacent second laser etching lines;
   wherein the first-axis sensing lines are electrically insulated from the second-axis sensing lines.

4. The method of manufacturing a touch electrode structure as claimed in claim 3, wherein the second-axis sensing lines and the second laser etching line are formed by etching the second conducting layer with a laser beam having a wavelength between 200 nm and 300 nm.

5. The method of manufacturing a touch electrode structure as claimed in claim 4, wherein the first conducting layer and the second conducting layer are located at different sides of a substrate.

6. The method of manufacturing a touch electrode structure as claimed in claim 1, wherein each first-axis sensing line comprises:
   a plurality of first conductive cells disposed at intervals along a first axis; and
   a plurality of first bridging wires electrically connecting the adjacent first conductive cells respectively;
   wherein a disposition area is delimited between the adjacent first-axis sensing lines and between the adjacent first conductive cells respectively.

7. The method of manufacturing a touch electrode structure as claimed in claim 6, further comprising:
   laser etching the first conducting layer to form a plurality of second conductive cells in the disposition area; and
   disposing a plurality of second bridging wires along a second axis, crossing over the first bridging wires to electrically connect the adjacent second conductive cells respectively;
   wherein connecting the second conductive cells along each second axis by the second bridging wires forms a second-axis sensing line.

8. The method of manufacturing a touch electrode structure as claimed in claim 7, wherein the second conductive cells are formed by etching the first conducting layer with a laser beam having a wavelength between 200 nm and 300 nm.

9. The method of manufacturing a touch electrode structure as claimed in claim 7, further comprising:
- disposing an insulation layer between each first bridging wire and each second bridging wire such that the first-axis sensing lines are electrically insulated from the second-axis sensing lines.

10. A touch electrode structure, comprising:
- a plurality of first-axis sensing lines at an inner side of a first external contour, wherein each said first-axis sensing line at least comprises a first output pin; a plurality of conducting portions at the outer side of the first external contour and surrounding the first output pins; wherein one of the conducting portions and the first output pin are separated by a distance, and the two adjacent conducting portions separated by a distance so as to allow the first output pins to be isolated from each other.

11. The touch electrode structure as claimed in claim 10, further comprising:
- a plurality of second-axis sensing lines at an inner side of a second external contour, wherein each said second-axis sensing line at least comprises a second output pin extending to an outer side of the second external contour;
- a plurality of second laser etching lines at the outer side of the second external contour and between the second output pins; and
- a second conductive layer having a portion at the outer side of the second external contour, wherein the second laser etching lines separate the portion of the second conductive layer into a plurality of second conducting portions, and each of the second conducting portions is between the two adjacent second laser etching lines.

12. The touch electrode structure as claimed in claim 11, wherein the first conducting layer and the second conducting layer are located at different sides of a substrate.

13. The touch electrode structure as claimed in claim 10, wherein each said first-axis sensing line comprises:
- a plurality of first conductive cells disposed at intervals along a first axis; and
- a plurality of first bridging wires electrically connecting the adjacent first conductive cells;
- wherein a disposition area is delimited between the adjacent first-axis sensing lines and between the adjacent first conductive cells respectively.

14. The touch electrode structure as claimed in claim 11, wherein each said second-axis sensing line comprises:
- a plurality of second conductive cells disposed in the disposition area respectively; and
- a plurality of second bridging wires crossing over the first bridging wires to electrically connect the adjacent second conductive cells along a second axis respectively.

15. The touch electrode structure as claimed in claim 14, further comprising:
- a plurality of insulation layers disposed between the first bridging wires and the second bridging wires such that the first-axis sensing lines are electrically insulated from the second-axis sensing lines.

16. The touch electrode structure as claimed in claim 11, wherein the first output pins and the second output pins are electrically connected to a flexible circuit respectively.

17. A touch panel, comprising:
- a substrate; and
- a first patterned conducting layer formed on the substrate, comprising:
    - a plurality of first axial sensing lines, each of the first axial sensing lines at least comprising a first output pin, the first output pins electrically insulated from each other, wherein the a plurality of first axial sensing lines are framed by a first external contour; and
    - wherein a plurality of first laser etching lines are formed in the first patterned conducting layer, surround the corresponding output pins and are at the outer side of the first external contour, wherein a part of the first patterned conducting layer at the outer side of the first external contour remains between the adjacent first laser etching lines.

18. The touch panel as claimed in claim 17, wherein a first laser etching line is between two conducting portions of the first patterned conducting layer at the outer side of the first external contours.

19. The touch panel as claimed in claim 17, wherein the two adjacent first output pins are separated from each other by a plurality of first laser etching lines and the part of the first patterned conducting layer at the outer side of the first external contour remains between the adjacent first laser etching lines.

* * * * *